(12) United States Patent  
Inoue et al.

(10) Patent No.: US 8,586,998 B2
(45) Date of Patent: Nov. 19, 2013

(54) SILICON CARBIDE SUBSTRATE MANUFACTURING METHOD AND SILICON CARBIDE SUBSTRATE

(75) Inventors: Hiroki Inoue, Itami (JP); Keiji Ishibashi, Itami (JP); Shinsuke Fujiwara, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 13/557,749

(22) Filed: Jul. 25, 2012

(65) Prior Publication Data

US 2013/0026497 A1    Jan. 31, 2013

Related U.S. Application Data

(60) Provisional application No. 61/513,075, filed on Jul. 29, 2011.

(30) Foreign Application Priority Data

Jul. 29, 2011   (JP) ................................ 2011-166133

(51) Int. Cl.
*H01L 29/38*   (2006.01)
(52) U.S. Cl.
USPC ............... 257/77; 257/E29.104; 257/E29.105

(58) Field of Classification Search
USPC .............................. 257/77, E29.104, E29.105
See application file for complete search history.

(56) References Cited

U.S. PATENT DOCUMENTS

| 7,422,634 B2 | 9/2008 | Powell et al. |
| 2007/0131967 A1 | 6/2007 | Kawaguchi et al. |
| 2007/0261633 A1 | 11/2007 | Tanaka |
| 2011/0012127 A1 | 1/2011 | Tanaka |
| 2011/0233562 A1 | 9/2011 | Harada et al. |

FOREIGN PATENT DOCUMENTS

| JP | 2007-153712 | 6/2007 |
| JP | 2007-217216 | 8/2007 |
| WO | WO 2010/119792 | 10/2010 |

*Primary Examiner* — Tan N Tran
(74) *Attorney, Agent, or Firm* — Drinker Biddle & Reath LLP

(57) ABSTRACT

Silicon carbide single crystal is prepared. Using the silicon carbide single crystal as a material, a silicon carbide substrate having a first face and a second face located at a side opposite to the first face is formed. In the formation of the silicon carbide substrate, a first processed damage layer and a second processed damage layer are formed at the first face and second face, respectively. The first face is polished such that at least a portion of the first processed damage layer is removed and the surface roughness of the first face becomes less than or equal to 5 nm. At least a portion of the second processed damage layer is removed while maintaining the surface roughness of the second plane greater than or equal to 10 nm.

2 Claims, 5 Drawing Sheets

SILICON CARBIDE SUBSTRATE MANUFACTURING METHOD AND SILICON CARBIDE SUBSTRATE

This application claims the benefit of U.S. Provisional Application No. 61/513,075 filed Jul. 29, 2011, which is incorporated by reference herein in the entirety.

BACKGROUND OF THE INVENTION

1. Field of the Invention

The present invention relates to a method of manufacturing a silicon carbide substrate, and a silicon carbide substrate.

2. Description of the Background Art

When the warp of a silicon carbide substrate is too great, inconvenience occurs in manufacturing a semiconductor device using the silicon carbide substrate. Therefore, the level of warping must be regulated. According to U.S. Pat. No. 7,422,634, a value representing the warping of a wafer is represented by "warp" that is the distance between the maximum value and minimum value of the wafer surface measured from a reference plane. This value is set smaller than approximately 0.5 µm. The specification of the cited reference discloses a method of using a double-side lapping device as an exemplary method of manufacturing a wafer. The publication teaches that polishing and etching are preferably carried out subsequent to usage of the double-side lapping device, and that the etching is dispensable.

Assuming that an equivalent damage layer is formed at each of the top face and backside face of the wafer (silicon carbide substrate) subsequent to processing by the double-side lapping device, it is considered that the warp of the silicon carbide substrate may become smaller since the stress at both of the damage layers becomes equivalent. However, the face formed by the lapping device generally has a relatively great surface roughness, not suitable to have an epitaxial layer of high quality formed thereon or a semiconductor element formed therefrom. Therefore, polishing of further accuracy is required after lapping.

If the aforementioned polishing is applied only to the top face (first face) among the top and backside faces, the damage layer at the top face and the damage layer at the backside face will no longer be equivalent since removal of the damage layer will be carried out at only the top face among the top face and backside face. As a result, the warp of the silicon carbide substrate is increased. This may cause inconvenience in manufacturing a semiconductor device. For example, the resolution in photolithography is degraded, or the wafer may be cracked when being fastened.

If the aforementioned polishing is carried out on both the top face and backside face, the surface roughness will be reduced, not only at the top face, but also at the backside face (second face). In other words, both the top face and backside face are mirrored. In other words, the appearance of each of the top face and backside face will become substantially the same. As a result, distinguishing between the top face and backside face will become difficult. Unlike a silicon substrate, the physical property differs between the top face and backside face of a silicon carbide substrate, since two types of planes, i.e. a Si plane and a C plane, are present due to the crystal structure thereof. Therefore, distinguishing between the top face and backside face is important even if the surface roughness is the same. Furthermore, the backside face having a mirrored face induces the problem that, when the backside face of the silicon carbide substrate is mounted on a stage, the backside face will slip on the stage or adhere to the stage.

SUMMARY OF THE INVENTION

In view of the foregoing, an object of the present invention is to provide a silicon carbide substrate having warping suppressed and including a first face that is a mirrored face and a second face that is a non-mirrored face.

A method of manufacturing a silicon carbide substrate of the present invention includes the steps set forth below. Silicon carbide single crystal is prepared. As the material of silicon carbide single crystal, a silicon carbide substrate having a first face and a second face located at the side opposite to the first face is formed. When the silicon carbide substrate is formed, a first processed damage layer and a second processed damage layer are formed at the first face and second face, respectively. The first face is polished such that at least a portion of the first processed damage layer is removed, and the first face has a surface roughness less than or equal to 5 nm. At least a portion of the second processed damage layer is removed while maintaining the surface roughness of the second layer greater than or equal to 10 nm.

According to a method of manufacturing a silicon carbide substrate of the present invention, warpage at the silicon carbide substrate can be suppressed by having at least a portion of each of the first and second processed damage layers removed. By setting the surface roughness of the first face less than or equal to 5 nm, the first face can be mirrored. Furthermore, since the surface roughness of the second face is maintained greater than or equal to 10 nm when the second processed damage layer, i.e. the processed damage layer formed at the second face, is removed. Thus, the first face can be mirrored and the second face not mirrored while suppressing warpage at the silicon carbide substrate.

Preferably in the method of manufacturing a silicon carbide substrate set forth above, the step of removing at least a portion of the second processed damage layer includes the step of etching the second face.

Accordingly, the surface roughness of the second face can be prevented from becoming too small when the second processed damage layer is removed.

Preferably in the method of manufacturing a silicon carbide substrate set forth above, the silicon carbide substrate has a plane shape encompassing a circle of 110 mm in diameter. Further preferably, the plan shape encompasses a circle of 150 mm in diameter.

Since the size of the silicon carbide substrate can be increased, a semiconductor device can be manufactured efficiently.

Preferably in the method of manufacturing a silicon carbide substrate set forth above, the step of removing at least a portion of the second processed damage layer is carried out prior to the step of polishing the first face.

This prevents the first face already polished from being damaged during the step of removing at least a portion of the second processed damage layer.

Preferably in the method of manufacturing a silicon carbide substrate set forth above, the second face is mechanically polished in forming a silicon carbide substrate. More preferably, the step of mechanically polishing the second face is carried out such that the surface roughness of the second plane becomes less than or equal to 1 µm.

Accordingly, the amount of the second processed damage layer can be reduced by having the second face mechanically polished. Accordingly, the step of removing at least a portion of the second processed damage layer can be carried out in a shorter period of time.

Preferably in the method of manufacturing a silicon carbide substrate set forth above, the step of removing at least a portion of the second processed damage layer includes the step of removing the second processed damage layer entirely.

Accordingly, the warpage at the silicon carbide substrate can be suppressed more efficiently.

Preferably, in the method of manufacturing a silicon carbide substrate set forth above, the silicon carbide substrate has an area of S square millimeters, and a thickness of T millimeters. S/T is greater than or equal to 9000 mm and not less than or equal to 90000 mm.

By S/T being greater than or equal to 9000 mm, the cost can be suppressed by reducing the volume of the silicon carbide substrate under a predetermined area. Since easiness of fracture of the silicon carbide substrate can be avoided by S/T being less than or equal to 90000 mm, the silicon carbide substrate can be handled more readily.

The silicon carbide substrate of the present invention has a single crystal structure, a plane shape encompassing a circle of 110 mm in diameter, an area of S square millimeters, a thickness of T millimeters, S/T greater than or equal to 9000 mm and less than or equal to 90000 mm, and warpage less than or equal to 50 μm, as well as a first face and second face. The first face has a surface roughness less than or equal to 5 nm. The second face is located at a side opposite to the first face, and has a surface roughness greater than or equal to 10 nm.

According to a silicon carbide substrate of the present invention, a semiconductor device can be manufactured efficiently by the silicon carbide substrate having a plane shape encompassing a circle of 110 mm in diameter. By reducing the volume of the silicon carbide substrate under a predetermined area by setting S/T greater than or equal to 9000 mm, the cost can be suppressed. By avoiding easiness of fracture of the silicon carbide substrate by setting S/T less than or equal to 90000 mm, the silicon carbide substrate can be handled readily. Furthermore, since the warpage of the silicon carbide substrate is less than or equal to 50 μm, an adverse effect caused by warpage upon manufacturing a semiconductor device using the silicon carbide substrate can be suppressed. By setting the surface roughness of the first face less than or equal to 5 nm and the surface roughness of the second face greater than or equal to 10 nm, the first face can be mirrored and the second face non-mirrored.

Preferably in the silicon carbide substrate set forth above, the plane shape encompasses a circle of 150 mm in diameter. Accordingly, a semiconductor device can be manufactured more effectively.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter based on the drawings.

In the present specification, a surface roughness Ra is used for the standard of the surface roughness. Surface roughness Ra is also referred to as arithmetic average roughness, or arithmetical mean deviation of profile. Specifically, surface roughness Ra is a value obtained by sampling a portion having a reference length from a roughness measurement curve in a direction of its mean line, integrating absolute values of deviation from the mean line of the sampled portion to the measurement curve, and dividing the integrated value by the reference length. The reference length is 80 μm, for example.

In the present specification, "warpage" is a value representing the level of warp at each of the top face and backside face of the substrate. Specifically, the warpage at the top face of the substrate is the difference in height between the highest point and lowest point at the surface when the least squares plane of the top face is taken as the reference height. The same applies to the backside face.

As to the crystallographic definitions in the present specification, the individual orientation is represented by [ ], the group orientation by < >, the individual plane by ( ) and the group plane by { }. For a negative index, a negative sign is applied before the numeral in the present specification although generally a bar (–) is attached above the numeral in crystallographic expressions.

(First Embodiment)

Figure 1:
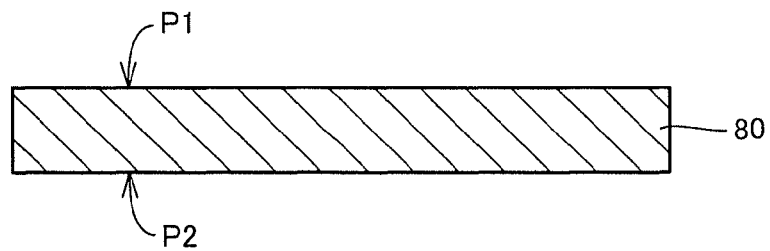
FIG. 1 is a schematic cross section of a configuration of a silicon carbide substrate according to a first embodiment of the present invention.

As shown in FIG. 1, a single crystal substrate 80 (silicon carbide substrate) of the present embodiment is formed of silicon carbide, having a single crystal structure, and including a top face P1 (first face) and a backside face P2 (second face) located at a side opposite to top face P1. Top face P1 has a surface roughness less than or equal to 5 nm. Backside face P2 has a surface roughness greater than or equal to 10 nm. In other words, top face P1 is mirrored, whereas backside face P2 is non-mirrored. By the difference in appearance therebetween, they can be distinguished from each other.

Preferably, a processed damage layer is substantially not present on each of top face P1 and backside face P2. As used herein, "processed damage layer" refers to a layer having crystal distortion generated during the process for forming a plane. The region where a processed damage layer is formed and the remaining proper region can be distinguished by observation through, for example, a transmittive type electronic microscope.

Single crystal substrate 80 has a plane shape encompassing a circle of 110 mm in diameter at each of top face P1 and backside face P2. Preferably, this plane shape encompasses a circle of 150 mm in diameter. In determining the presence of this encompassment, the presence of an orientation flat or notch for identifying the orientation of single crystal substrate 80 can be neglected.

Top face P1 (or backside face P2) of single crystal substrate 80 has an area of S square millimeters and a thickness of T millimeters. S/T is greater than or equal to 9000 mm and less than or equal to 90000 mm. For example, when the plane shape of single crystal substrate 80 is a circle of 150 mm in diameter, the surface S is approximately 18000 square millimeters. Thickness T is 0.6 mm, for example. In the case where area S and thickness T correspond to such examples, S/T=30,000 mm.

Furthermore, the warpage of single crystal substrate 80, i.e. the warpage at each of top face P1 and backside face P2, is less than or equal to 50 μm.

Preferably, the crystal structure of single crystal substrate 80 is the hexagonal system. Further preferably, the plane orientation of top face P1 is closer to (000-1) as compared to the plane orientation of backside face P2. In other words, the index m is a negative value at the plane orientation (hklm) of top face P1. For example, top face P1 is (000-1), (0-33-8) or (0-11-2).

Figure 3:
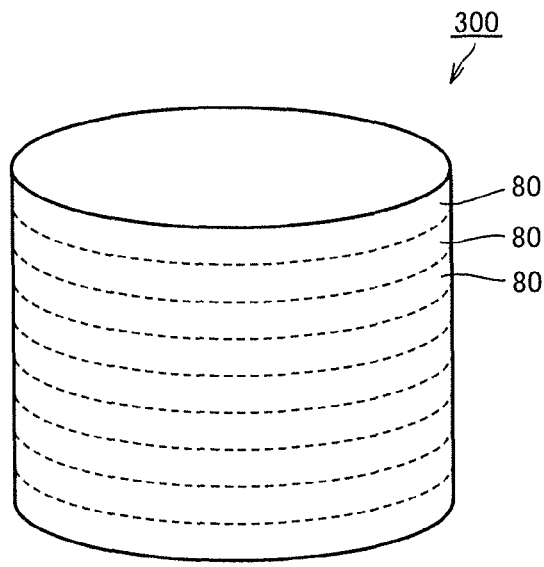
FIG. 3 is a perspective view schematically representing a first step in the method of manufacturing a silicon carbide substrate according to the first embodiment of the present invention.
Figure 4:
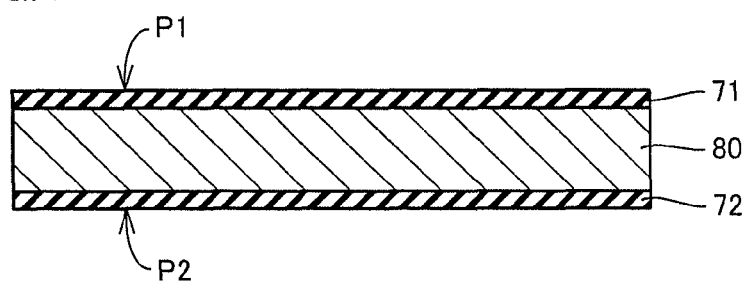
FIG. 4 is a sectional view schematically representing a second step in the method of manufacturing a silicon carbide substrate according to the first embodiment of the present invention.
Figure 5:
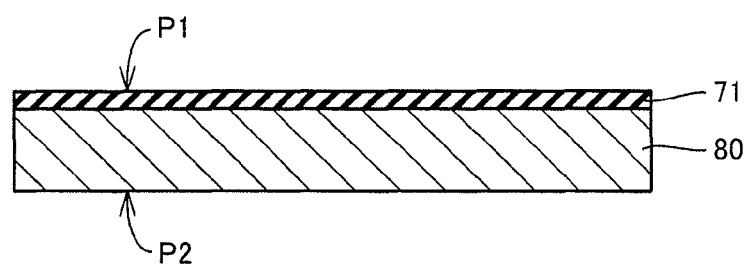
FIG. 5 is a sectional view schematically representing a third step in the method of manufacturing a silicon carbide substrate according to the first embodiment of the present invention.

The method of manufacturing single crystal substrate 80 (FIG. 2) will be described with reference to FIGS. 3-5.

Figure 2:
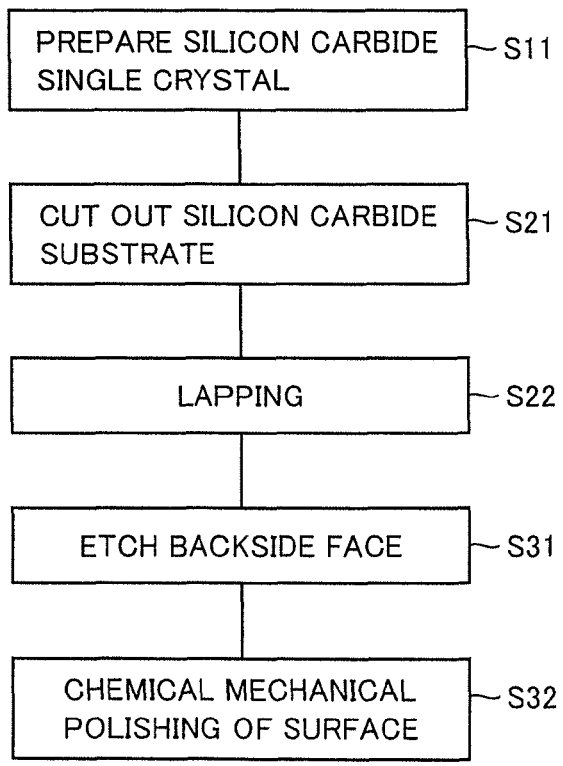
FIG. 2 is a flowchart schematically representing a method of manufacturing a silicon carbide substrate according to the first embodiment of the present invention.

First, silicon carbide single crystal 300 (FIG. 3) is prepared (FIG. 2: step S11). Silicon carbide single crystal 300 can be formed by recrystallization through sublimation using seed crystal made of silicon carbide.

Using silicon carbide single crystal 300 as the material, single crystal substrate 80 is formed. Single crystal substrate 80 can be formed by being cutting out from silicon carbide single crystal 300 (FIG. 2: step S21). Following this cut out, lapping that will be described afterwards may be carried out (FIG. 2: step S22). In this case, single crystal substrate 80 is formed by steps S21 and S22. Preferably, top face P1 (or backside face P2) of the formed single crystal substrate 80 has a plane shape encompassing a circle of 110 mm in diameter. Further preferably, the plane shape encompasses a circle of 150 mm in diameter.

When single crystal substrate 80 is formed as set forth above, processed damage layers 71 and 72 (FIG. 4) are formed at top face P1 and backside face P2, respectively.

In the present specification, "lapping" refers to polishing through mechanical measures until the surface roughness becomes less than or equal to 1 μm, for example. This lapping grinds away the substrate surface at a relatively high speed, disallowing the surface roughness to be reduced to less than 10 nm. Furthermore, mechanical damage is applied to the surface. The depth of this processing damage is, for example, several μm, which is smaller than the thickness of the processed damage layer formed when single crystal substrate 80 is cut out from silicon carbide single crystal 300. Therefore, if lapping is applied after single crystal substrate 80 is cut out, the thickness of each of processed damage layers 71 and 72 is reduced to some level. Preferably, the lapping of backside face P2 is carried out such that the surface roughness thereof is greater than or equal to 10 nm and less than or equal to 1 μm. This lapping may be carried out by polishing using a metal plate.

At least a portion of processed damage layer 72 is removed while maintaining the surface roughness of backside face P2 greater than or equal to 10 nm. Preferably, processed damage layer 72 is substantially removed. More preferably, processed damage layer 72 is entirely removed (FIG. 5). Specifically, backside face P2 is etched (FIG. 2: step S31). Etching is specifically carried out by dry etching using etching gas, sublimation of silicon carbide by heating, or by wet etching. For dry etching, reactive ion etching (RIE) using $O_2$ gas and $SF_6$ gas can be employed. Alternatively, heating may be employed under an atmosphere including $Cl_2$ gas and $O_2$ gas, or an atmosphere including $H_2$ gas. For wet etching, dipping into a molten KOH is may be carried out. For dry etching, the level of etching can be controlled accurately. When sublimation is employed, the facility therefor can be simplified. Moreover, the implementation can be conducted readily on a mass production scale. In the case where wet etching is employed, the facility can be rendered simple.

Then, top face P1 is polished such that the surface roughness thereof (FIG. 5) is less than or equal to 5 nm. By this polishing, at least a portion of processed damage layer 71 (FIG. 5) is removed. Preferably, processed damage layer 71 is substantially removed. More preferably, processed damage layer 72 is entirely removed. Unlike lapping using a metal plate, this polishing uses a soft pad and an abrasive, carried out by CMP (Chemical Mechanical Polishing), for example (FIG. 2: step S32).

Thus, single crystal substrate 80 (FIG. 1) of the present embodiment can be obtained.

By having at least a portion of each of processed damage layers 71 and 72 (FIG. 4) removed according to the present embodiment, warpage of single crystal substrate 80 can be suppressed. Furthermore, by setting the surface roughness of top face P1 (FIG. 1) less than or equal to 5 nm, top face P1 can be mirrored. Furthermore, since the surface roughness of backside face P2 is maintained greater than or equal to 10 nm when processed damage layer 72 (FIG. 4) is removed, backside face P2 (FIG. 5) can be maintained non-mirrored. Thus, top face P1 can be mirrored whereas backside face P2 is non-mirrored while suppressing warpage at single crystal substrate 80 (FIG. 1).

Preferably, removal of processed damage layer 72 is carried out by etching backside face P2. Accordingly, the surface roughness of backside face P2 can be prevented from becoming too small when processed damage layer 72 is removed. If removal of processed damage layer 72 at backside face P2 is carried out by a way similar to the polishing of top face P1, the surface roughness of backside face P2 will become too small. In other words, backside face P2 will be mirrored. Even if removal of processed damage layer 72 is carried out by the aforementioned lapping, the lapping itself will induce a new processed damage layer. Sufficient removal of a processed damage layer was difficult.

Preferably, single crystal substrate 80 has a plane shape encompassing a circle of 110 mm in diameter. Further preferably, the plane shape encompasses a circle of 150 mm in diameter. Since the size of single crystal substrate 80 can be set large thereby, a semiconductor device can be manufactured effectively. An example of a method of manufacturing a semiconductor device will be described afterwards. Preferably, the removal of processed damage layer 72 is carried out prior to polishing top face P1. Accordingly, top face P1 already subjected to polishing can be prevented from receiving damage during removal of processed damage layer 72.

Preferably, backside face P2 is lapped prior to removal of processed damage layer 72. More preferably, the lapping of backside face P2 is carried out such that the surface roughness of backside face P2 becomes less than or equal to 1 µm. Since the amount of processed damage layer 72 can be reduced thereby, the removal of processed damage layer 72 through etching or the like can be carried out in a shorter period of time.

Preferably, processed damage layer 72 (FIG. 4) is entirely removed. Accordingly, the warpage of single crystal substrate 80 (FIG. 1) can be suppressed more sufficiently.

Preferably, top face P1 (or backside face P2) of single crystal substrate 80 has an area of S square millimeters, and a thickness of T millimeters. S/T is greater than or equal to 9000 mm and less than or equal to 90000 mm. By setting S/T greater than or equal to 9000 mm, the volume of single crystal substrate 80 can be reduced under a predetermined area. Therefore, the cost thereof can be suppressed. Furthermore, by setting S/T less than or equal to 90000 mm, easiness of fracture of single crystal substrate 80 can be avoided to allow single crystal substrate 80 to be handled easier. Furthermore, since the warpage of single crystal substrate 80 is less than or equal to 50 µm, an adverse effect caused by warpage on the fabrication of a semiconductor device using single crystal substrate 80 can be suppressed.

(Second Embodiment)

A semiconductor device using single crystal substrate 80 (FIG. 1) of the first embodiment will be described in the present embodiment.

Figure 6:
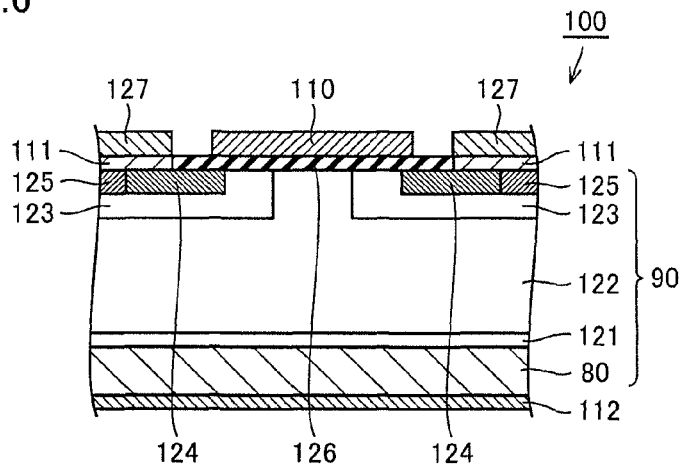
FIG. 6 is a sectional view schematically representing a configuration of a silicon carbide semiconductor device according to a second embodiment of the present invention.

As shown in FIG. 6, the semiconductor device of the present embodiment is an MOSFET 100, specifically a vertical type DiMOSFET (Double Implanted MOSFET). MOSFET 100 includes an epitaxial substrate 90, a gate insulating film 126, a source electrode 111, an upper source electrode 127, a gate electrode 110, and a drain electrode 112. Epitaxial substrate 90 includes a single crystal substrate 80, a buffer layer 121, a breakdown voltage holding layer 122, a p region 123, an n$^+$ region 124 and a p$^+$ region 125.

Single crystal substrate 80 and buffer layer 121 are of n conductivity type. The concentration of the n type conduction impurities in buffer layer 121 is $5 \times 10^{17}$ cm$^{-3}$, for example. The thickness of buffer layer 121 is 0.5 µm, for example.

Breakdown voltage holding layer 122 is formed on buffer layer 121, made of n conductivity type silicon carbide. For example, the thickness of breakdown voltage holding layer 122 is 10 µm, and the concentration of the n type conduction impurities is $5 \times 10^{15}$ cm$^{-3}$.

At the surface of breakdown voltage holding layer 122, a plurality of p regions 123 having p type conductivity are formed spaced apart from each other. In and at the surface layer of p region 123, an n$^+$ region 124 is formed. A p$^+$ region 125 is formed adjacent to n$^+$ region 124. Gate insulating film 126 is formed on a region of breakdown voltage holding layer 122 exposed between p regions 123. Specifically, gate insulating film 126 is formed extending from above n$^+$ region 124 at one of p regions 123, over p region 123, a region of breakdown voltage holding layer 122 exposed between two p regions 123, the other p region 123, as far as above n$^+$ region 124 at the relevant other p region 123. Gate electrode 110 is formed on gate insulating film 126. Source electrode 111 is formed on n$^+$ region 124 and p$^+$ region 125. Upper source electrode 127 is formed on source electrode 111.

The maximum value of the nitrogen atom concentration at a region within 10 nm from the boundary between gate insulating film 126 and the semiconductor layer including n$^+$ region 124, p$^+$ region 125, p region 123 and breakdown voltage holding layer 122 is greater than or equal to $1 \times 10^{21}$ cm$^{-3}$. Accordingly, the mobility at the channel region particularly under gate insulating film 126 (the region in contact with gate insulating film 126 and the portion of p region 123 located between n$^+$ region 124 and breakdown voltage holding layer 122).

A method of manufacturing MOSFET 100 using single crystal substrate 80 will be described hereinafter.

Figure 7:
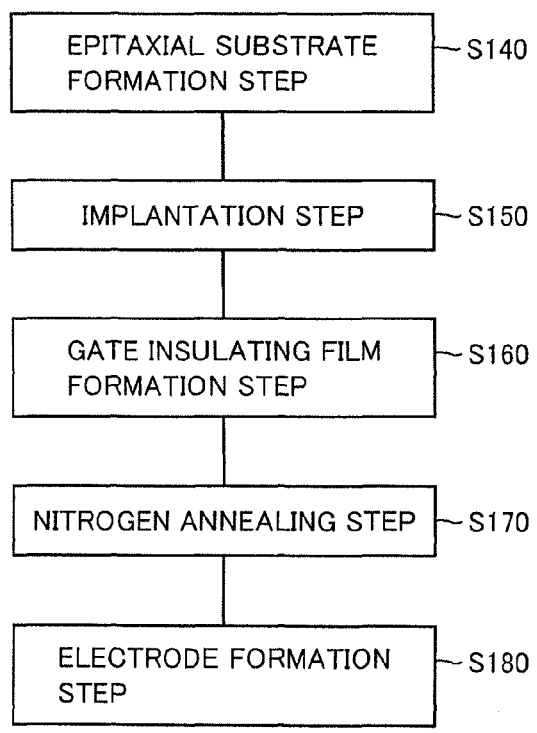
FIG. 7 is a schematic flowchart of a method of manufacturing a silicon carbide semiconductor device according to the second embodiment of the present invention.
Figure 8:
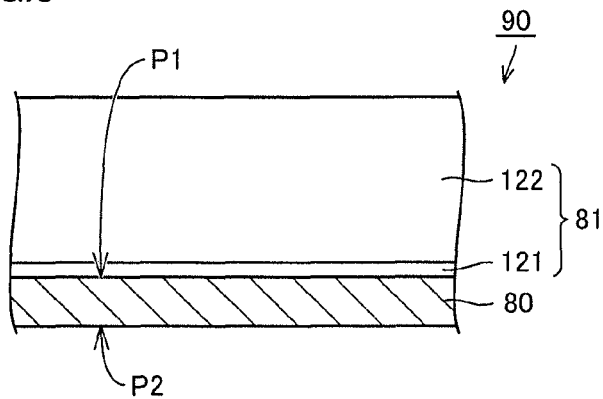
FIG. 8 is a sectional view schematically representing a first step in the method of manufacturing a silicon carbide semiconductor device according to the second embodiment of the present invention.

As shown in FIG. 8, epitaxial layer 81 is formed on top face P1 of single crystal substrate 80. Specifically, buffer layer 121 is formed on single crystal substrate 80, and breakdown voltage holding layer 122 is formed on buffer layer 121. Accordingly, epitaxial substrate 90 is formed (FIG. 7: step S140).

Buffer layer 121 is made of n conductivity type silicon carbide, having a thickness of 0.5 µm, for example. The concentration of the conduction impurities in buffer layer 121 is $5 \times 10^{17}$ cm$^{-3}$, for example. The thickness of breakdown voltage holding layer 122 is set at 10 µm, for example. The concentration of n type conduction impurities at breakdown voltage holding layer 122 is $5 \times 10^{15}$ cm$^{-3}$, for example.

Figure 9:
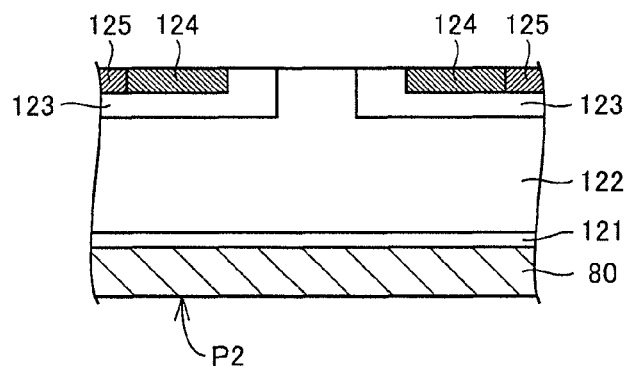
FIG. 9 is a sectional view schematically representing a second step in the method of manufacturing a silicon carbide device according to the second embodiment of the present invention.

As shown in FIG. 9, by an implantation step (FIG. 7: step S150), p region 123, n$^+$ region 124 and p$^+$ region 125 are formed as set forth below.

First, p type conduction impurities are selectively introduced into a region of breakdown voltage holding layer 122 to form p region 123. Then, n type conduction impurities are selectively introduced into a predetermined region to form n$^+$ region 124. Also, p type conduction impurities are selectively introduced into a predetermined region to form p$^+$ region 125. Selective introduction of impurities is carried out using a mask made of an oxide film, for example.

Following such an implantation step, activation annealing is carried out. For example, annealing is carried out for 30 minutes at the heating temperature of 1700° C. in an argon atmosphere, for example.

Figure 10:
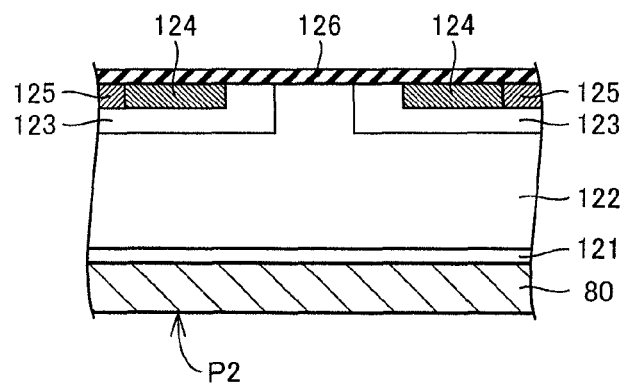
FIG. 10 is a sectional view schematically representing a third step in the method of manufacturing a silicon carbide device according to the second embodiment of the present invention.

As shown in FIG. 10, a gate insulating film formation step (FIG. 7: step S160) is carried out. Specifically, gate insulating film 126 is formed to cover breakdown voltage holding layer 122, p region 123, and n$^+$ region 124 and p$^+$ region 125. This formation may be carried out by dry oxidation (thermal oxidation). The dry oxidization conditions include, for example, a heating temperature of 1200° C. and a heating time of 30 minutes.

Then, a nitride annealing step (FIG. 7: step S170) is carried out. Specifically, annealing is carried out in a nitrogen oxide (NO) atmosphere. The processing conditions include, for example, a heating temperature of 1100° C. and a heating time of 120 minutes. As a result, nitrogen atoms are introduced in the proximity of the boundary between gate insulating film 126 and each of breakdown voltage holding layer 122, p region 123, n$^+$ region 124 and p$^+$ region 125.

Following this annealing step using nitrogen oxide, an annealing process using argon (Ar) gas that is inert gas may be carried out. The processing conditions include, for example, a heating temperature of 1100° C. and a heating time of 60 minutes.

Figure 11:
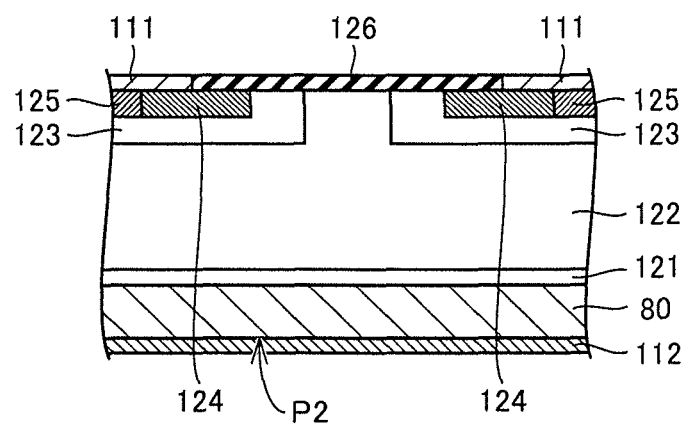
FIG. 11 is a sectional view schematically representing a fourth step in the method of manufacturing a silicon carbide device according to the second embodiment of the present invention.

As shown in FIG. 11, by an electrode formation step (FIG. 7: step S180), source electrode 111 and drain electrode 112 are formed as set forth below.

On gate insulating film 126, a resist film having a pattern is formed by photolithography. Using this resist film as a mask, the region of gate insulating film 126 located above n+ region 124 and p+ region 125 is removed by etching. Accordingly, an opening is formed at gate insulating film 126. At this opening, a conductor film is formed to be brought into contact with each of n+ region 124 and p+ region 125. Then, by removing the resist film, the region of the aforementioned conductor film located on the resist film is removed (lift off). The conductor film may be a metal film, for example nickel (Ni). As a result of the lift off, source electrode 111 is formed.

At this stage, heat treatment is preferably carried out for alloying. For example, heat treatment is carried out for 2 minutes at the heating temperature of 950° C. in an atmosphere of argon (Ar) gas that is inert gas.

Referring to FIG. 6 again, upper source electrode 127 is formed on source electrode 111. Also, gate electrode 110 is formed on gate insulating film 126. Furthermore, drain electrode 112 is formed on the back face (in the drawing, bottom face) of single crystal substrate 80.

Thus, a MOSFET 100 is obtained.

According to the present embodiment, the usage of single crystal substrate 80 with small warpage further facilitates the manufacturing of MOSFET 100. For example, the resolution of photolithography can be improved, or the fracture at the substrate when single crystal substrate 80 is fastened during manufacturing of MOSFET 100 can be prevented.

By virtue of top face P1 being mirrored and backside face P2 being non-mirrored, top face P1 where epitaxial layer 81 is to be formed can be readily distinguished from backside face P2 in the formation of epitaxial substrate 90 (FIG. 8).

In the steps shown in FIGS. 8-10, the event of backside face P2 slipping on a stage (not shown) of a manufacturing device or adhering to the stage when backside face P2 is mounted on the stage can be prevented.

A configuration in which the conductivity types are interchanged, i.e. the p type and n type exchanged, may be employed. Furthermore, although the description is based on MOSFET 100, the semiconductor device may be a metal insulator semiconductor FET (MISFET) other than a MOSFET. Moreover, the semiconductor device is not limited to a MOSFET, and may be an IGBT (Insulated Gate Bipolar Transistor) or a JFET (Junction FET).

EXAMPLES

First, as a single crystal substrate 80 (FIG. 4) with processed damage layers 71 and 72, a substrate having a plane shape of a circle, 150 mm in diameter, was prepared in various thickness. The plane orientation of the substrate was 4° off from the (0001) plane. In preparing a substrate, the surface roughness of backside face P2 was set at approximately 15 nm by lapping. For removing processed damage layer 72 (FIG. 4) from backside face P2 (FIG. 4), RIE employing $O_2$ gas and $SF_6$ gas was carried out to etch away the region down to the depth of 5 μm from the surface. Then, the surface roughness of top face P1 was set less than 1 nm by CMP. Thus, single crystal substrate 80 (FIG. 1) having various thickness for the example was obtained.

As a comparative example, a substrate was produced with the aforementioned removal step of the damage layer by etching was omitted.

The warpage at the single crystal substrate of the present example and comparative example was measured. The results are shown in the table set forth below.

TABLE 1

| S/T | Warpage (μm) | |
|---|---|---|
| (mm) | No etching | Etching applied |
| 9000 | 51 | 9 |
| 11000 | 55 | 7 |
| 19000 | 80 | 10 |
| 30000 | 120 | 11 |
| 45000 | 170 | 10 |
| 60000 | 240 | 12 |
| 79000 | Measurement not possible | 10 |
| 90000 | Measurement not possible | 11 |

In the comparative example, i.e. in the case of "no etching", the warpage exceeded 50 μm when S/T was greater than or equal to 9000 mm. When S/T was greater than or equal to 79000, the warpage could not be measured since the substrate was readily broken. In contrast, in the example of the present invention, i.e. in the case of "etching applied", the warpage could be set less than or equal to 50 μm even when S/T was greater than or equal to 9000 mm.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide substrate having a single crystal structure, a plane shape encompassing a circle of 110 millimeter in diameter, an area of S square millimeters, a thickness of T millimeters, S/T greater than or equal to 9000 millimeters and less than or equal to 90000 millimeters, and warpage less than or equal to 50 micrometers, said silicon carbide substrate comprising:
    a first face having a surface roughness less than or equal to 5 nanometers, and
    a second face located at a side opposite to said first face, and having a surface roughness greater than or equal to 10 nanometers.

2. The silicon carbide substrate according to claim 1, wherein said plane shape encompasses a circle of 150 millimeters in diameters.

* * * * *